US00RE50651E

(19) United States
(12) Reissued Patent
Kim et al.

(10) Patent Number: US RE50,651 E
(45) Date of Reissued Patent: Oct. 28, 2025

(54) ELECTRO-LUMINESCENCE DISPLAY APPARATUS

(71) Applicant: LG DISPLAY CO., LTD., Seoul (KR)

(72) Inventors: Harkjin Kim, Incheon (KR); Hoyoung Jeong, Goyang-si (KR); Shin-Bok Lee, Seoul (KR)

(73) Assignee: LG Display Co., Ltd., Seoul (KR)

(21) Appl. No.: 18/240,255

(22) Filed: Aug. 30, 2023

Related U.S. Patent Documents

Reissue of:
(64) Patent No.: 11,108,026
Issued: Aug. 31, 2021
Appl. No.: 16/669,182
Filed: Oct. 30, 2019

(30) Foreign Application Priority Data

Nov. 19, 2018 (KR) ..... 10-2018-0142802

(51) Int. Cl.
*H01L 51/52* (2006.01)
*H01L 27/15* (2006.01)
(Continued)

(52) U.S. Cl.
CPC ..... *H10K 59/875* (2023.02); *H10H 29/142* (2025.01); *H10K 50/125* (2023.02);
(Continued)

(58) Field of Classification Search
CPC ..... H10K 50/8426; H10K 59/875; H10K 50/865; H10K 59/8792; H10K 59/122; H10K 50/84; H10K 50/85; H10K 50/125; H10K 59/126; H10K 2102/103; H10K 2102/3031; H10K 59/87; H10K 59/80524;
(Continued)

(56) References Cited

U.S. PATENT DOCUMENTS 8,044,573 B2 * 10/2011 Kim ..... H01L 51/5284 313/504
9,324,766 B2 4/2016 Kim
(Continued)

FOREIGN PATENT DOCUMENTS

JP 2005019074 A 1/2005
KR 20100131074 A 12/2010
(Continued)

OTHER PUBLICATIONS

Korean Office Action dated Apr. 1, 2024 issued in Patent Application No. 10-2024-0022323 w/English Translation (11 pages).
(Continued)

*Primary Examiner* — Lee E Sanderson
(74) *Attorney, Agent, or Firm* — Fish & Richardson P.C.

(57) ABSTRACT

An electro-luminescence display apparatus comprises a transparent substrate; a thin-film transistor array disposed on the transparent substrate; a first electrode disposed on the thin-film transistor array; an electro-luminescence diode disposed on the first electrode; a second electrode disposed on the electro-luminescence diode; an encapsulation unit disposed on the second electrode; and an external light-absorbing layer disposed on the encapsulation unit and absorbing external light that passes through the transparent substrate.

32 Claims, 5 Drawing Sheets

(51) Int. Cl.

| | |
|---|---|
| ***H01L 27/32*** | (2006.01) |
| ***H01L 51/50*** | (2006.01) |
| ***H10H 29/14*** | (2025.01) |
| ***H10K 50/125*** | (2023.01) |
| ***H10K 50/84*** | (2023.01) |
| ***H10K 50/842*** | (2023.01) |
| ***H10K 50/85*** | (2023.01) |
| ***H10K 50/86*** | (2023.01) |
| ***H10K 59/122*** | (2023.01) |
| ***H10K 59/126*** | (2023.01) |
| ***H10K 59/80*** | (2023.01) |
| *H10K 102/10* | (2023.01) |

(52) U.S. Cl.
CPC ..... *H10K 50/84* (2023.02); *H10K 50/8426* (2023.02); *H10K 50/85* (2023.02); *H10K 50/865* (2023.02); *H10K 59/122* (2023.02); *H10K 59/126* (2023.02); *H10K 59/8792* (2023.02); *H10K 59/80524* (2023.02); *H10K 59/87* (2023.02); *H10K 59/8722* (2023.02); *H10K 2102/103* (2023.02)

(58) Field of Classification Search
CPC ..... H10K 59/8722; H01L 27/156; H01L 51/5284; H01L 27/3246; H01L 27/3272; H01L 51/5036; H01L 51/5237; H01L 51/5246; H01L 51/5262; H01L 2251/308; Y02E 10/549
See application file for complete search history.

(56) References Cited

U.S. PATENT DOCUMENTS

| | | | | |
|---|---|---|---|---|
| 9,502,655 | B2 | 11/2016 | Kim | |
| 2001/0040645 | A1* | 11/2001 | Yamazaki | H01L 27/124 349/42 |
| 2003/0012936 | A1* | 1/2003 | Draheim | G06F 3/041 348/E5.131 |
| 2004/0066136 | A1* | 4/2004 | Yoneda | H01L 51/5262 313/505 |
| 2004/0263065 | A1* | 12/2004 | Yeh | H01L 27/3244 313/504 |
| 2005/0062399 | A1* | 3/2005 | Gotoh | H10K 50/85 313/497 |
| 2012/0267611 | A1* | 10/2012 | Chung | H01L 27/3272 257/40 |
| 2016/0049426 | A1 | 2/2016 | Lim et al. | |
| 2016/0049443 | A1 | 2/2016 | Kim et al. | |
| 2016/0049454 | A1 | 2/2016 | Park et al. | |
| 2016/0190222 | A1* | 6/2016 | Chen | H01L 51/56 257/40 |
| 2016/0254395 | A1 | 9/2016 | Jiang et al. | |
| 2019/0267575 | A1* | 8/2019 | Liu | H01L 51/5234 |

FOREIGN PATENT DOCUMENTS

| | | | |
|---|---|---|---|
| KR | 10-2014-0066612 | A | 6/2014 |
| KR | 10-2015-0084566 | A | 7/2015 |
| KR | 20150126509 | A | 11/2015 |
| KR | 10-2016-0021329 | A | 2/2016 |
| KR | 2016-0015815 | A | 2/2016 |
| KR | 2016-0021334 | A | 2/2016 |
| KR | 2016-0030699 | A | 3/2016 |
| KR | 10-2016-0140089 | A | 12/2016 |
| KR | 10-2017-0045659 | A | 4/2017 |
| KR | 10-2017-0081102 | A | 7/2017 |
| KR | 20180074171 | A | 7/2018 |

OTHER PUBLICATIONS

Extended European Search Report in European Appln. No. 24210823.1, mailed on Feb. 13, 2025, 9 pages.

Office Action in Korean Appln. No. 20240120816, mailed on Nov. 14, 2024, 17 pages (with English translation).

Y. Karasawa et al., "Electroluminescence Display Device, Method of Manufacturing the Same and Electronic Apparatus", English Translation of JP 2005-19074 A, JPO, Jan. 2005.*

European Search Report dated Apr. 23, 2020 for corresponding European Application No. EP 19208220.

Lucia Gomes, et al., "IZO deposition by RF and DC sputtering on paper and application on flexible electrochromic devices", ELSEVIER, Displays 34 (2013) 326-333, Contents lists available at SciVerse ScienceDirect, Article Info., Article History: Available online Jul. 15, 2013 in 8 pages.

* cited by examiner

ELECTRO-LUMINESCENCE DISPLAY APPARATUS

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS REFERENCE TO RELATED APPLICATION

This application claims priority to and the benefit of Korean Patent Application No. 10-2018-0142802 filed on Nov. 19, 2018, which is hereby incorporated by reference in its entirety.

BACKGROUND

Field of the Disclosure

The present disclosure relates to a display apparatus, and more particularly, to an electro-luminescence display apparatus that can reduce reflectance of external light.

Description of the Background

An electro-luminescence display apparatus may receive an image signal and may display an image in a display area. The electro-luminescence display apparatus may be implemented with the technologies of a micro light emitting diode (micro LED) that is an electro-luminescence diode, an organic light emitting diode (OLED), a quantum-dot light emitting diode (QLED) and the like.

A conventional electro-luminescence display apparatus includes a polarizing plate capable of absorbing external light on a display surface on which an image is displayed, to improve low quality of images, which is caused by external light reflectance.

Conventionally, a circular polarizer is attached to a display surface of an electro-luminescence display apparatus to effectively reduce reflection of external light. However, the polarizer is thick and is not flexible. Accordingly, it is difficult to apply the polarizer to a thin electro-luminescence display apparatus, a flexible display apparatus, a rollable display apparatus, a foldable display apparatus and the like.

The above information disclosed in this Background section is only for enhancement of understanding of the background of the described technology and therefore it may contain information that does not form prior art that is already known in this country to a person of ordinary skill in the art.

SUMMARY

Accordingly, the present disclosure is directed to an electro-luminescence display apparatus that substantially obviates one or more of problems due to limitations and disadvantages of the prior art.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure provides improvement in quality of images of a display apparatus, which is lowered due to surface reflection of the display apparatus by external light.

The present disclosure also provides an electro-luminescence display apparatus that can reduce reflectance of external light with a cathode of the electro-luminescence display panel and that can have a small thickness.

The present disclosure further provides an electro-luminescence display apparatus in which the electro-luminescence display panel can reduce reflectance of external light and a polarizing plate can be removed, thereby improving luminance.

The present disclosure is not limited to what has been described. Additionally, other objectives that have not been mentioned may be clearly understood from the following description by one having ordinary skill in the art to which the present disclosure pertains.

The electro-luminescence display apparatus according to aspects may include a transparent substrate, a thin-film transistor array on the transparent substrate, a first electrode on the thin-film transistor array, an electro-luminescence diode on the first electrode, a second electrode on the electro-luminescence diode, an encapsulation unit on the second electrode, and an external light-absorbing layer on the encapsulation unit.

The external light-absorbing layer may be configured to absorb visible light. The external light-absorbing layer may include at least one or more of pigment black, black resins, graphite, gravure ink, black spray, black enamel, chromium, and low reflective metal.

The electro-luminescence diode may be configured to emit first light toward the first electrode and to emit second light toward the second electrode, and the external light-absorbing layer may be configured to absorb the second light, and external light that passes through the transparent substrate.

The external light-absorbing layer may be configured to absorb at least 80% or more of the second light.

The external light-absorbing layer may be configured to absorb external light that is input to the transparent substrate.

The electro-luminescence display apparatus may further include an adhesive layer that is placed on the external light-absorbing layer, and a second substrate that is placed on the adhesive layer. The second substrate may consist of opaque metal.

The first electrode may have at least 80% or more of visible light transmittance, and the second electrode may have at least 80% or more of visible light transmittance.

A rear surface of the transparent substrate may be directly exposed to external light.

External light reflectance of a display area of the electro-luminescence display apparatus may be at least 5% or less.

The electro-luminescence display apparatus may further include a bank that is placed on the first electrode and that is overlapped with an edge of the first electrode, and the bank may be configured to absorb at least 80% or more of visible light.

The thin-film transistor array of the electro-luminescence display apparatus may include at least a first metallic layer and a second metallic layer, and may further include a light-absorbing layer that is placed on a rear surface of at least one or more of the first metallic layer and the second metallic layer.

The electro-luminescence display apparatus may further include a phase-correction layer that is placed between at least one or more metallic layers and the light-absorbing layer.

The light-absorbing layer may include one of copper oxide, nickel oxide, molybdenum oxide, and oxide of an alloy that includes two or more of copper/nickel/molybdenum.

The phase-correction layer may include one of silicon nitride, IGZO and ITO.

The electro-luminescence display apparatus according to aspects may include a thin-film transistor array that is formed on a transparent substrate, a first electrode on the thin-film transistor array, an electro-luminescence diode on the thin-film transistor array, a second electrode on the electro-luminescence diode, and an external light-absorbing layer that is placed on the second electrode and is configured to absorb external light passing through the transparent substrate, the first electrode, the electro-luminescence diode, and the second electrode so as to improve an ambient light contrast ratio.

The transparent substrate may be configured to display an image through the rear surface thereof. The transparent substrate may not include a polarizing plate on the rear surface thereof. The rear surface of the transparent substrate may be configured to contact air. The rear surface of the transparent substrate may be provided with an anti-reflection coating.

Details of other aspects are included in the detailed description and the drawings.

The electro-luminescence display apparatus according to aspects may improve quality of images because the external light-absorbing layer absorbs external light that is input through the transparent substrate.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
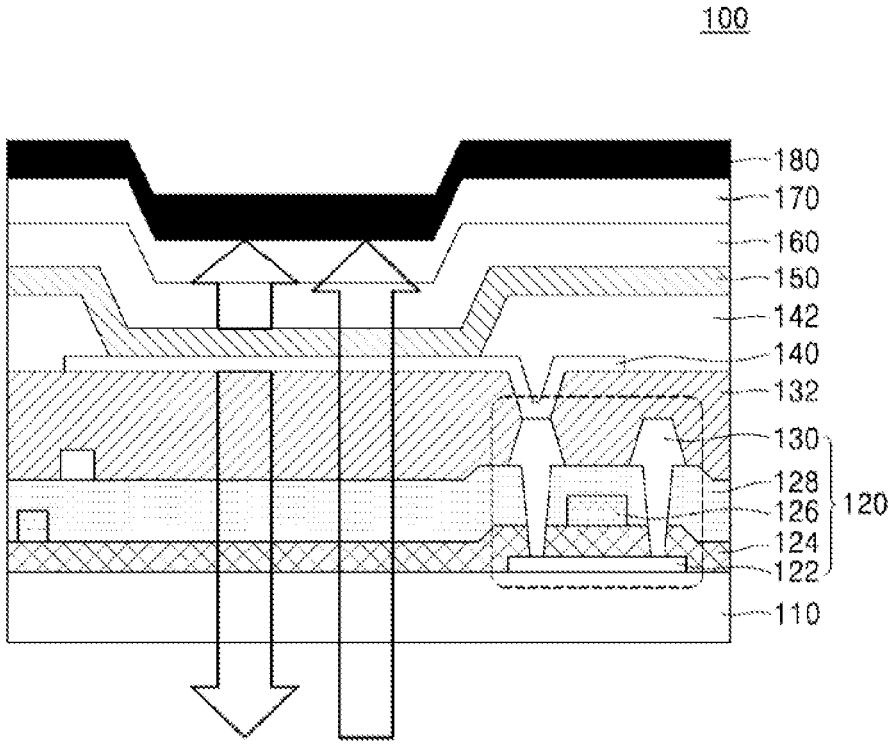
FIG. 1 is a cross-sectional view schematically illustrating an electro-luminescence display apparatus according to an aspect of the present disclosure.

Advantages and features of the present disclosure, and methods for implementing the advantages and features are clearly understood from the following detailed description of aspects in conjunction with the attached drawings. The inventive subject matter of the present disclosure, however, may be embodied in various different forms, and should not be construed as being limited to the aspects set forth hereunder. Rather, the aspects are provided as examples so that the disclosure will be thorough and complete, and will fully convey the scope of the disclosure to one having ordinary skill in the art. The present disclosure should be defined only according to the scope of the appended claims.

The shapes, sizes, ratios, angles, and number of elements illustrated in the drawings for describing the aspects are presented only as examples. Accordingly, the present disclosure is not limited to the drawings. Throughout the specification, like reference numerals denote like elements. Additionally, in describing the present disclosure, detailed description of the publicly-known technologies in relation to the disclosure is avoided if it is deemed to make the gist of the disclosure unnecessarily vague. When used in this specification, the terms "comprise", "have", "consist of" and the like imply the presence or addition of other elements. The singular forms "a", "an" and "the" are intended to include the plural forms as well, unless explicitly indicated otherwise.

When interpreted, elements should be interpreted as including a margin of error though not explicitly described.

When special terms such as "on", "above", "below", "next to" and the like are used to describe positions of two portions, one or more additional portions may be placed between the two portions unless the term "right" or "directly" is used.

When an element or a layer is described as being "on" another element or another layer, the element may or the layer may be placed right on another element or another layer, and an additional element may be interposed between the element or the layer and another element or another layer.

When used to describe various elements, the terms "first", "second" and the like are used herein only to distinguish one element from another element. The elements should not be limited by the terms. Thus, a below-mentioned first element may be a second element within the technical spirit of the present disclosure.

Through the specification, identical reference numerals denote identical elements.

The size and thickness of each of the elements illustrated in the drawings are illustrated for convenience of description, and the elements are not necessarily limited to the size and thickness illustrated in this specification.

Each of the features of various aspects of the present disclosure may be partially or entirely coupled or combined. It will be apparent to those skilled in the art that the aspects may be technically linked and operated in various ways and that each aspect may be implemented independently and codependently.

Aspects of the present disclosure are described below with reference to the attached drawings.

FIG. 1 is a cross-sectional view schematically illustrating an electro-luminescence display apparatus according to an aspect of the present disclosure.

Hereunder, the electro-luminescence display apparatus 100 according to an aspect is described with reference to FIG. 1. The electro-luminescence display apparatus 100 according to an aspect may include a transparent substrate 110, a thin-film transistor array 120 that is placed on the transparent substrate 110, a first electrode 140 that is placed on the thin-film transistor array 120, an electro-luminescence diode 150 that is placed on the first electrode 140, a second electrode 160 that is placed on the electro-luminescence diode 150, an encapsulation unit 170 that is placed on the second electrode 160, and an external light-absorbing layer 180 that is placed on the encapsulation unit 170.

The electro-luminescence display apparatus 100 may include a display area in which a plurality sub pixels, including the thin-film transistor array 120, the first electrode 140, the electro-luminescence diode 150, and the second electrode 160 on the transparent substrate 110, are arranged. Each of the sub pixels may be configured to emit visible light in a range of specific wavelengths on the basis of an image signal that is supplied through the thin-film transistor array 120. Accordingly, the electro-luminescence display apparatus 100 may display an image.

The transparent substrate 110 is configured to be transparent to visible light. Accordingly, light that displays an image may be displayed through the transparent substrate 110. Additionally, external light may pass through the transparent substrate 110. The transparent substrate 110 may be configured to include at least glass or plastics. The transparent substrate 110 may have the property of rigidity or flexibility. Thus, the transparent substrate 110 may transmit external light.

The thin-film transistor array 120 may include a semiconductor layer 122, a first metallic layer 126 that is overlapped with the semiconductor layer 122 and that supplies a scanning signal, a first insulation layer 124 that electrically insulates the semiconductor layer 122 and the first metallic layer 126, a second metallic layer 130 that is electrically connected with the semiconductor layer 122 and that is electrically insulated from the first metallic layer 126, and a second insulation layer 128 that electrically insulates the first metallic layer 126 and the second metallic layer 130.

The semiconductor layer 122 may consist of silicon, polysilicon, oxide semiconductor and the like. A part of the semiconductor layer 122 may be doped with impurities to become conductive. The area that becomes conductive may be referred to as a source or a drain. An area that does not become conductive may be referred to as a channel. However, in the present disclosure, a material of the semiconductor layer 122 is not restricted.

The first metallic layer 126 may be a part of a gate line, a data line or a bridge. For example, a part of the first metallic layer 126 may be configured to function as a gate line. The first metallic layer 126 may include a metallic material having the property of low resistance such as aluminum (Al), aluminum alloys (AlNd), copper (Cu), copper alloys, molybdenum (Mo), and molybdenum titanium (MoTi). However, the first metallic layer 126 is not limited to what has been described.

The first insulation layer 124 may be placed between the semiconductor layer 122 and the first metallic layer 126. The first insulation layer 124 may consist of an inorganic insulation material. For example, the first insulation layer 124 may include silicon oxide (SiO2) or silicon nitride (SiNx). The first insulation layer 124 may be provided with a contact hole such that an electrically conductive material on the first insulation layer 124 is electrically connected with an electrically conductive material beneath the first insulation layer 124. The first insulation layer 124, for example, may be a gate insulation film. However, the first insulation layer 124 is not limited to what has been described.

The first insulation layer 124 is configured to be transparent to visible light. Accordingly, the transparent substrate 110 and the first insulation layer 124 may transmit external light.

The second metallic layer 130 may be a part of a gate line, a data line or a bridge. For example, a part of the second metallic layer 130 may be configured to function as a data line. The second metallic layer 130 may consist of a metallic material having the property of low resistance, i.e., any one of aluminum (Al), an aluminum-neodymium alloy (AlNd), copper (Cu), a copper alloy, molybdenum (Mo), and molybdenum titanium (MoTi). However, the second metallic layer 130 is not limited to what has been described.

The second insulation layer 128 may be placed between the first metallic layer 126 and the second metallic layer 130. The second insulation layer 128 may consist of an inorganic insulation material. For example, the second insulation layer 128 may include silicon oxide (SiO2) or silicon nitride (SiNx). The second insulation layer 128 may be provided with a contact hole such that an electrically conductive material on the second insulation layer 128 is electrically connected with an electrically conductive material beneath the second insulation layer 128. However, the second insulation layer 128 is not limited to what has been described.

The second insulation layer 128 is configured to be transparent to visible light. Accordingly, the transparent substrate 110, the first insulation layer 124, and the second insulation layer 128 may transmit external light.

An organic layer 132 may be placed on the thin-film transistor array 120. The organic layer 132 may be configured to compensate a stepped portion caused by patterning of various metallic layers of the thin-film transistor array 120, and a stepped portion caused by patterning of the contact holes. Accordingly, a top surface of the organic layer 132 may be flatter than a rear surface of the organic layer 132. The organic layer 132 is configured to be transparent to visible light. Accordingly, the transparent substrate 110, the first insulation layer 124, the second insulation layer 128, and the organic layer 132 may transmit external light.

The first electrode 140 may be placed on the organic layer 132. The first electrode 140 may be electrically connected with the thin-film transistor array 120. The first electrode 140 may be supplied with voltage and/or electric current that correspond to an image signal from the thin-film transistor array 120. For example, the first electrode 140 may be electrically connected with the second metallic layer 130. The first electrode 140, for example, may be an anode electrode.

As a transparent electrode, the first electrode 140 according to an aspect may be a material that may have 80% or more of visible light transmittance and that may be used as an anode electrode. Accordingly, the transparent substrate 110, the first insulation layer 124, the second insulation layer 128, the organic layer 132, and the first electrode 140 may transmit external light.

The first electrode 140, for example, may include at least one or more of indium tin oxide (ITO), indium zinc oxide (IZO), indium tin zinc oxide (ITZO), and Al2O3 doped ZnO (AZO).

A bank 142 may be placed on the first electrode 140. The bank 142 may consist of an organic material and may be overlapped with an edge of the first electrode 140 in a way that encircles each of the sub pixels. That is, the bank 142 is configured to have an opened area that corresponds to a light-emitting area of each sub pixel. Additionally, the electro-luminescence diode 150 may be placed in the opened area. The bank 142, for example, may include benzocyclobutene (BCB), polyimide resin, or photo acryl. However, the bank 142 is not limited to what has been described.

The bank 142 is configured to be transparent to visible light. Accordingly, the transparent substrate 110, the first insulation layer 124, the second insulation layer 128, the organic layer 132, and the bank 142 may transmit external light.

The electro-luminescence diode 150 may be placed on the first electrode 140. The electro-luminescence diode 150 may be commonly formed in the display area or may be formed to correspond to each sub pixel. For example, when the electro-luminescence diode 150 is commonly formed in the display area, the electro-luminescence diode 150 may be configured to emit white light. In this case, the electro-luminescence diode 150 may be formed in the entire display area without an additional mask. When the electro-luminescence diode 150 is formed to correspond to the sub pixel, the electro-luminescence diode 150 may be configured to emit red light, green light, and blue light. In this case, a red electro-luminescence diode that emits red light, a green electro-luminescence diode that emits green light, and a blue electro-luminescence diode that emits blue light may be respectively formed using a fine metal mask. However, the red electro-luminescence diode, the green electro-luminescence diode, and the blue electro-luminescence diode are not limited to what has been described.

The electro-luminescence diode 150 includes a light-emitting layer. The electro-luminescence diode 150 may be formed in a single layer or in multiple layers and may further include at least one or more of a hole injection layer, a hole transport layer, and an electron transport layer to enhance performance of the electro-luminescence diode 150. However, the electro-luminescence diode 150 is not limited to what has been described. The light-emitting layer may include host or dopant materials that are different for each sub pixel on the basis of wavelengths of emitted light. However, the light-emitting layer is not limited to what has been described.

The electro-luminescence diode 150 may be configured to emit light toward the first electrode 140 and the second electrode 160. That is, the electro-luminescence diode 150 is configured to emit first light toward the first electrode 140 and to emit second light toward the second electrode 160.

The electro-luminescence diode 150 is configured to be transparent to visible light. Accordingly, the transparent substrate 110, the first insulation layer 124, the second insulation layer 128, the organic layer 132, the first electrode 140, and the electro-luminescence diode 150 may transmit external light.

The second electrode 160 may be placed on the electro-luminescence diode 150. The second electrode 160 may be configured to cover the electro-luminescence diode 150. The second electrode 160, for example, may be a cathode electrode.

As a transparent electrode, the second electrode 160 according to an aspect may be a material that may have 80% or more of visible light transmittance and that may be used as a cathode electrode.

The second electrode 160, for example, may include at least one or more of indium tin oxide (ITO), indium zinc oxide (IZO), indium tin zinc oxide (ITZO), and Al2O3 doped ZnO (AZO). The electro-luminescence diode 150 is configured to be transparent to visible light. Accordingly, the transparent substrate 110, the first insulation layer 124, the second insulation layer 128, the organic layer 132, the first electrode 140, the electro-luminescence diode 150, and the second electrode 160 may transmit external light.

The encapsulation unit 170 may be placed on the electro-luminescence diode 150. The encapsulation unit 170 may include an inorganic insulation material. For example, the encapsulation unit 170 may include at least one of silicon oxide ($SiO_2$), silicon nitride ($SiN_x$) and aluminum oxide ($Al_2O_3$). The encapsulation unit 170 protects the electro-luminescence diode 150 from oxygen and moisture. Accordingly, the encapsulation unit 170 may be thicker than the first insulation layer 124 and the second insulation layer 128 to enhance the performance of preventing oxygen and moisture. However, the encapsulation unit 170 is not limited to what has been described.

The encapsulation unit 170 may be formed in a single layer but may not be limited. The encapsulation unit 170 may have a structure in which at least one or more of inorganic insulation layers and at least one or more of organic insulation layers are stacked.

The encapsulation unit 170 is configured to be transparent to visible light. Accordingly, the transparent substrate 110, the first insulation layer 124, the second insulation layer 128, the organic layer 132, the first electrode 140, the electro-luminescence diode 150, the second electrode 160, and the encapsulation unit 170 may transmit external light.

The external light-absorbing layer 180 may be placed on the encapsulation unit 170. The external light-absorbing layer 180 may be configured to absorb external light that is transmitted up to the external light-absorbing layer 180 through the transparent substrate 110 and to reduce re-reflection of the external light toward the transparent substrate 110. That is, the external light-absorbing layer 180 is configured to absorb visible light.

The external light-absorbing layer 180 may be configured to absorb at least 80% or more of visible light. Alternatively, the external light-absorbing layer 180 may be configured to absorb at least 90% or more of visible light.

The external light-absorbing layer 180, for example, may include at least one or more of pigment black, black resins, graphite, black ink, gravure ink, black spray, black enamel, chromium (Cr), and low reflective metal.

Further, the electro-luminescence display apparatus 100 according to an aspect may be a bottom-emission type electro-luminescence display apparatus that is configured to emit light toward the transparent substrate 110.

In a conventional bottom-emission type electro-luminescence display apparatus, a conventional cathode electrode consists of a reflective material with high reflectance of visible light. This is to improve luminance of a conventional electro-luminescence display apparatus by reflecting second light that is emitted toward the conventional reflective cathode electrode toward the transparent substrate 110. However, the conventional reflective cathode also reflects external light. Thus, a contrast ratio of external light drops, and the quality of images is reduced.

A greater amount of external light reflected from the display area of an electro-luminescence display apparatus 100 leads to a lower quality of images of the electro-luminescence display apparatus 100. Additionally, brightness of external light that is reflected from the display area is much higher than maximum brightness of an image of the electro-luminescence display apparatus 100. Accordingly, quality of the image recognized by a user is greatly affected by the amount of reflection of external light.

In the electro-luminescence display apparatus 100 according to an aspect, the external light-absorbing layer 180 is configured to absorb second light that is emitted from the electro-luminescence diode 150 and at the same time, absorb external light that reaches the external light-absorbing layer 180 through the transparent substrate 110.

That is, the external light-absorbing layer 180 is configured to simultaneously absorb second light that is output from the electro-luminescence diode 150, and external light that passes through the transparent substrate 110. Unlike the conventional reflective cathode electrode, the external light-absorbing layer 180 according to an aspect may reduce maximum luminance of the electro-luminescence display apparatus 100 because light that is reflected toward the transparent substrate 110 is absorbed, but can improve the quality of images, which is lowered due to reflection of external light.

That is, external light reflectance of the electro-luminescence display apparatus 100 may be effectively reduced because the external light-absorbing layer 180 according to an aspect may effectively absorb external light that is input through the transparent substrate 110. The external light-absorbing layer 180 may be configured to cover the entire display area of the electro-luminescence display apparatus 100. Accordingly, the external light-absorbing layer 180 may absorb external light of the entire display area of the electro-luminescence display apparatus 100. As a result, an ambient light contrast ratio may improve.

Additionally, when external light is absorbed by the external light-absorbing layer 180, a polarizing plate that may be provided on the rear surface of the transparent substrate 110 may not be required. Accordingly, the external light may be directly input to the transparent substrate 110 without passing through the polarizing plate. When the polarizing plate is removed, an increase in thickness of the electro-luminescence display apparatus, which is cause by the polarizing plate, may not occur, and manufacturing costs may be reduced.

Further, a conventional polarizing plate has about 42% of visible light transmittance. Accordingly, luminance of a convention display apparatus is reduced due to the polarizing plate. Additionally, in the electro-luminescence display apparatus 100 according to the aspects of the present disclosure, about 50% of first light is output toward the first electrode 140, and about 50% of second light is output toward the second electrode 160.

Accordingly, in comparison between luminance of a conventional display apparatus including a polarizing plate and luminance of the display apparatus including the external light-absorbing layer according to the aspects of the present disclosure, the display apparatus including the external light-absorbing layer may achieve about 50% of luminance on the basis of first light while the conventional display apparatus including a polarizing plate may achieve about 42% of luminance on the basis of first light. Thus, the display apparatus of the present disclosure may provide luminance higher than that of the conventional display apparatus.

Further, the polarizing plate has low flexibility. Thus, when being bent, the polarizing plate may have a crack. As a result, the polarizing plate may reduce flexibility of the electro-luminescence display apparatus 100. However, the electro-luminescence display apparatus 100 according to an aspect does not require a polarizing plate. Thus, the electro-luminescence display apparatus 100 may be applied to a rollable display apparatus, a foldable display apparatus and the like.

Figure 2:
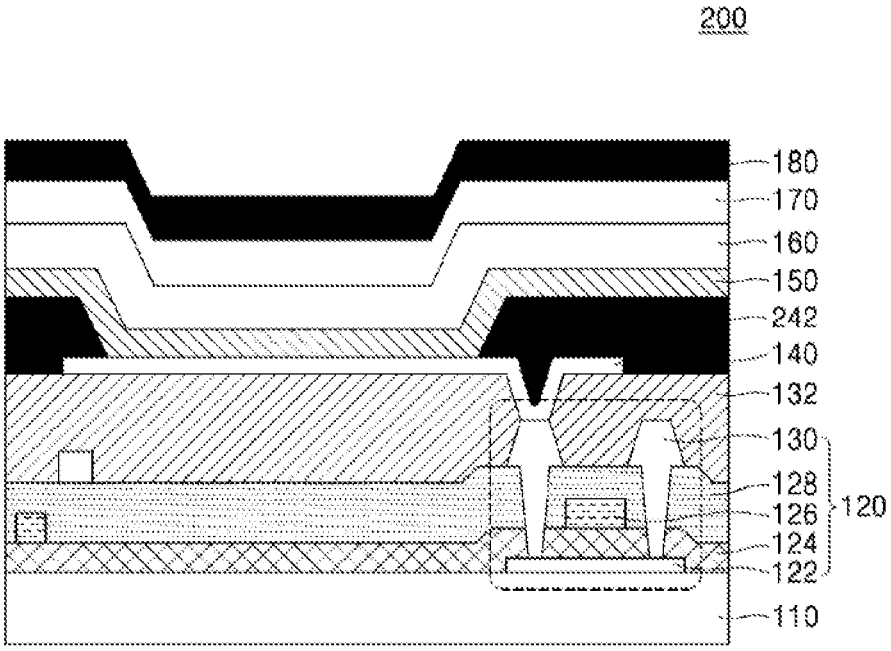
FIG. 2 is a cross-sectional view schematically illustrating an electro-luminescence display apparatus according to another aspect of the present disclosure.

FIG. 2 is a cross-sectional view schematically illustrating an electro-luminescence display apparatus according to another aspect of the present disclosure.

The electro-luminescence display apparatus 200 according to another aspect is described below with reference to FIG. 2. The electro-luminescence display apparatus 200 according to another aspect is substantially similar to the electro-luminescence display apparatus 100 according to an aspect. Accordingly, repetition of description is avoided for convenience of description.

A bank 242 of the electro-luminescence display apparatus 200 according to another aspect may be configured to absorb at least 80% or more of visible light. Alternatively, the bank 242 may be configured to absorb at least 90% or more of visible light. The bank 242, for example, may further include at least one or more of pigment black, black resins, graphite, black ink, gravure ink, black spray, and black enamel. With the above-described configuration, external light may be absorbed by the bank 242 before reaching the external light-absorbing layer 180. Additionally, external light that passes through an opened area of the bank 242, i.e., an area of the first electrode 140 may be absorbed by the external light-absorbing layer 180. With the above-described configuration, an ambient light contrast ratio of the electro-luminescence display apparatus 200 may improve further.

Figure 3:
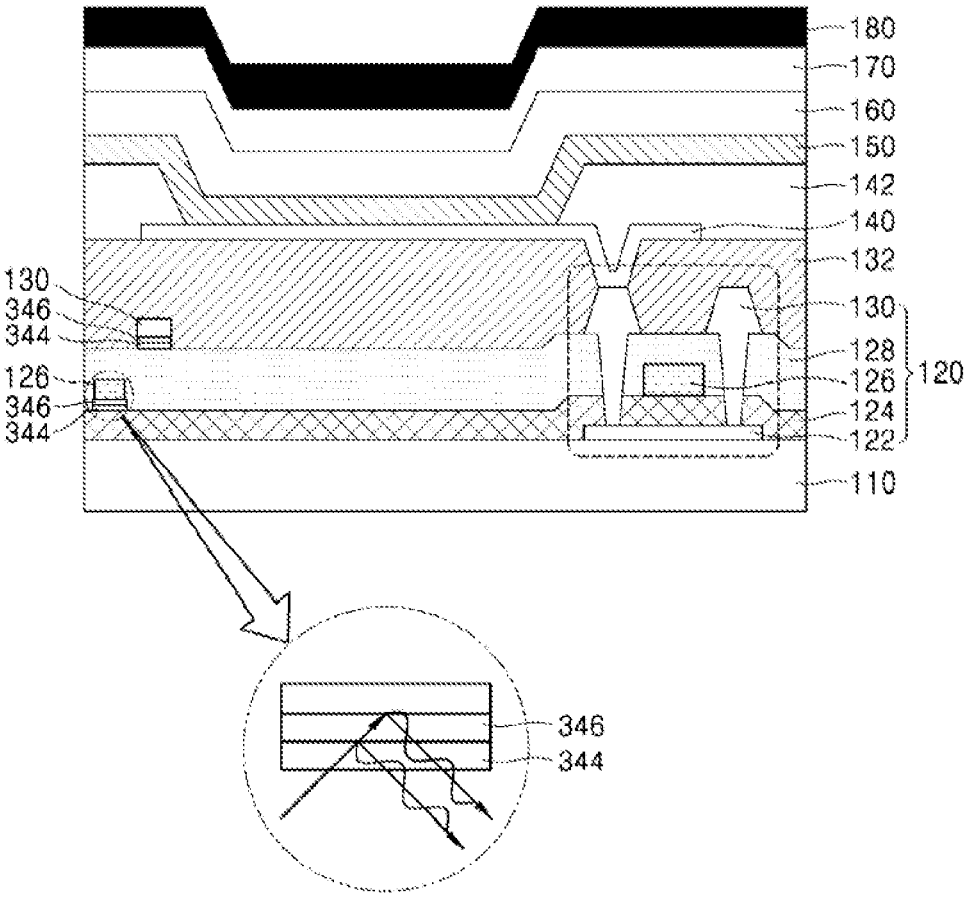
FIG. 3 is a cross-sectional view schematically illustrating an electro-luminescence display apparatus according to another aspect of the present disclosure.

FIG. 3 is a cross-sectional view schematically illustrating an electro-luminescence display apparatus according to another aspect of the present disclosure.

The electro-luminescence display apparatus 300 according to another aspect is described below with reference to FIG. 3. The electro-luminescence display apparatus 300 according to another aspect is substantially similar to the electro-luminescence display apparatus 100 according to an aspect. Accordingly, repetition of description is avoided for convenience of description.

A light-absorbing layer 344 may be further placed on rear surfaces of the first metallic layer 126 and the second metallic layer 130 of the electro-luminescence display apparatus 300 according to another aspect. However, a position of the light-absorbing layer is not limited to what has been described. A phase-correction layer 346 may be further placed between the light-absorbing layer 344, and the first and second metallic layers 126, 130.

The light-absorbing layer 344, for example, may be applied to the rear surfaces of the first metallic layer 126 and the second metallic layer 130 but is not limited to what has been described. The light-absorbing layer 344 may also be provided in an area from which external light may be reflected.

The light-absorbing layer 344, for example, may be copper oxide ($CuO_x$), nickel oxide ($NiO_x$), molybdenum oxide ($MoO_x$), or oxide of an alloy that includes two or more of copper/nickel/molybdenum. The light-absorbing layer 344, for example, may consist of metal oxide or alloy oxide, and the metal or the alloy may have an extinction coefficient of a complex refractive index of 0.4 or more. However, the light-absorbing layer 344 is not limited to what has been described. The light-absorbing layer 344 may consist of applicable metal oxide considering refractive indices, extinction coefficients and the like. With the above-described configuration, the light-absorbing layer 344 may absorb external light.

Additionally, the complex refractive index is calculated using n+ik. When a value that is calculated using n and k becomes grater, an amount of light that is absorbed by a material may become greater. In the complex refractive index, when the value k is greater than 0, it means a material is transparent. In the present disclosure, metal oxides with the extinction coefficient k of the complex refractive index of 0.4 or greater is used for a light-absorbing layer, the light-absorbing layer may absorb external light of unpolarized light, thereby enhance the effect of low reflection. That is, when the extinction coefficient of the complex refractive index is 0.4 or greater, low reflection caused by refraction may increase.

The phase-correction layer 346, for example, may be transparent oxide such as silicon nitride (SiNx), indium gallium zinc oxide (IGZO), indium tin oxide (ITO) and the like, which has a refractive index similar to a refractive index of copper oxide (CuOx). However, the phase-correction layer 346 is not limited what has been described.

The light-absorbing layer 344 and the phase-correction layer 346 may have a thickness of 500 to 1000 Å. However, the light-absorbing layer 344 and the phase-correction layer 346 are not limited to what has been described.

When the phase-correction layer 346 is placed on the light-absorbing layer 344, a phase difference may be compensated by destructive interference. Accordingly, phase difference interference is done to external light by the phase-correction layer 346 thereby reducing reflectance of the external light further. Specifically, when the light-absorbing layer 344 and the phase-correction layer 346 has a double-layer structure, reflectance of external light of the first metallic layer 126 and the second metallic layer 130 may be 10% or less.

Figure 4:
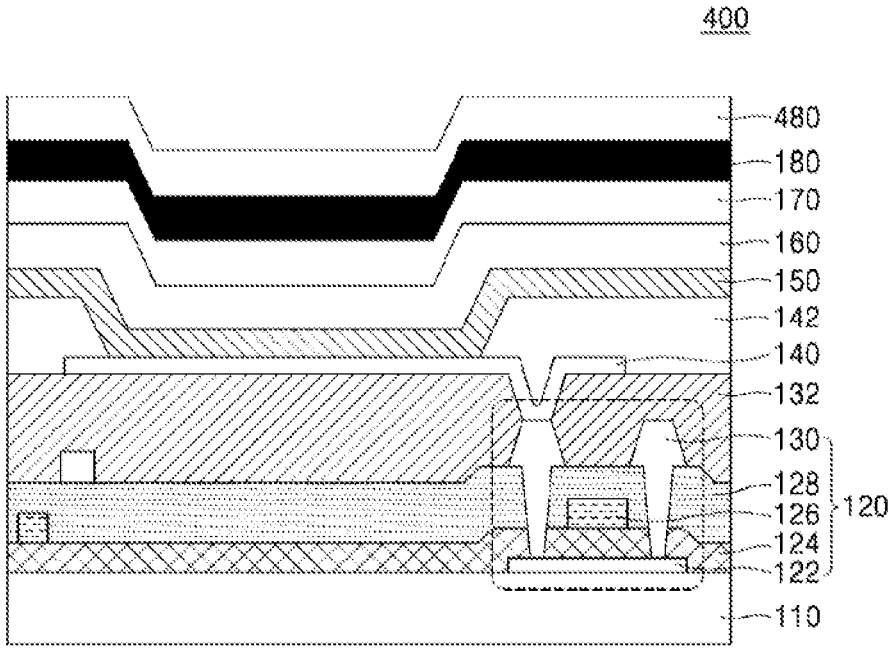
FIG. 4 is a cross-sectional view schematically illustrating an electro-luminescence display apparatus according to another aspect of the present disclosure.

FIG. 4 is a cross-sectional view schematically illustrating an electro-luminescence display apparatus according to another aspect of the present disclosure.

The electro-luminescence display apparatus 400 according to another aspect is described below with reference to FIG. 4. The electro-luminescence display apparatus 400 according to another aspect is substantially similar to the electro-luminescence display apparatus 100 according to an aspect. Accordingly, repetition of description is avoided for convenience of description.

A second encapsulation unit 480 may be further placed on the external light-absorbing layer 180 of the electro-luminescence display apparatus 400 according to another aspect. The second encapsulation unit 480 may consist of an inorganic insulation material. For example, the second encapsulation unit 480 may include at least silicon oxide ($SiO_2$), silicon nitride ($SiN_x$) or aluminum oxide ($Al_2O_3$). However, the second encapsulation unit 480 is not limited to what has been described. With the above-described configuration, the second encapsulation unit 480 protects the external light-absorbing layer 180 from oxygen and moisture, and even when the encapsulation unit 170 has a crack, may protect the electro-luminescence display apparatus 400.

Figure 5:
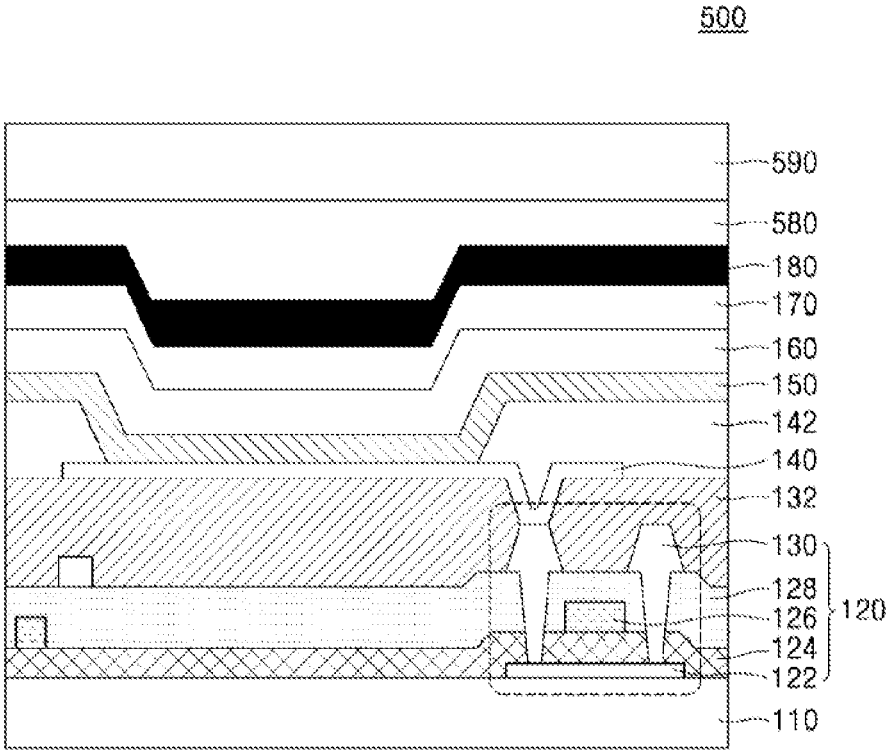
FIG. 5 is a cross-sectional view schematically illustrating an electro-luminescence display apparatus according to yet another aspect of the present disclosure.

FIG. 5 is a cross-sectional view schematically illustrating an electro-luminescence display apparatus according to yet another aspect of the present disclosure.

The electro-luminescence display apparatus 500 according to yet another aspect is described below with reference to FIG. 5. The electro-luminescence display apparatus 500 according to yet another aspect is substantially similar to the electro-luminescence display apparatus 100 according to an aspect. Accordingly, repetition of description is avoided for convenience of description.

An adhesive layer 580 and a second substrate 590 may be further placed on the external light-absorbing layer 180 of the electro-luminescence display apparatus 500 according to yet another aspect.

The adhesive layer 580 may fix the second substrate 590. The adhesive layer 580 may be placed on the external light-absorbing layer 180. The adhesive layer 580 may be a heat-curing adhesive or a pressure-curing adhesive.

The second substrate 590 may be an opaque metallic substrate, and for example, may be an alloy that includes aluminum (Al), copper (Cu), Invar or two or more metallic materials. However, the second substrate 590 is not limited to what has been described. The second substrate 590 may be glass.

With the above-described configuration, the second substrate 590 may protect the electro-luminescence display apparatus 500 from external impact. Additionally, when the second substrate 590 consists of a material with a high Young's modulus, the second substrate 590 may be applied to a rollable display, and may allow the electro-luminescence display apparatus 500 to maintain flatness when the electro-luminescence display apparatus 500 is unrolled even in the case in which the electro-luminescence display apparatus 500 is rolled up for a long time. Further, when the second substrate 590 is opaque, the second substrate 590 may block external light from being input from a top surface of the electro-luminescence display apparatus 500. Furthermore, the second substrate 590 may protect the external light-absorbing layer 180 from oxygen and moisture, and even when the encapsulation unit 170 has a crack, may protect the electro-luminescence display apparatus 500.

In some aspects, a color filter may be further provided between the transparent substrate 110 and the first electrode 140.

In some aspects, an anti-reflection coating may be further provided on the rear surface of the transparent substrate 110. The anti-reflection coating is a coating for reducing surface reflectance of the rear surface of the transparent substrate 110. For example, a material such as $MgF_2$, $Al_2O_3/MgF_2$, $TiO_2/SiO_2$, and the like may be optionally used for the anti-reflection coating. However, the anti-reflection coating is not limited to what has been described.

In some aspects, at least one or more buffer layers that consist of silicon oxide (SiO2) or silicon nitride ($SiN_x$), which are an inorganic insulation material, may be further formed between the semiconductor layer 122 and the transparent substrate 110. When at least one or more insulation material layers are provided beneath the semiconductor layer 122, a negative effect of alkali ions released from the inside of the transparent substrate 110 on properties of the semiconductor layer 122 may be reduced. However, the buffer layer is not limited to what has been described.

The aspects of the present disclosure may be described as follows.

The electro-luminescence display apparatus according to the aspects may include a transparent substrate, a thin-film transistor array on the transparent substrate, a first electrode on the thin-film transistor array, an electro-luminescence diode on the first electrode, a second electrode on the electro-luminescence diode, an encapsulation unit on the second electrode, and an external light-absorbing layer on the encapsulation unit.

The external light-absorbing layer may be configured to absorb visible light. The external light-absorbing layer may include at least one or more of pigment black, black resins, graphite, gravure ink, black spray, black enamel, chromium, and low reflective metal.

The electro-luminescence diode may be configured to emit first light toward the first electrode and to emit second light toward the second electrode, and the external light-absorbing layer may be configured to absorb the second light and external light that passes through the transparent substrate.

The external light-absorbing layer may be configured to absorb at least 80% or more of the second light.

The external light-absorbing layer may be configured to absorb external light that is input to the transparent substrate.

The electro-luminescence display apparatus may further include an adhesive layer that is placed on the external light-absorbing layer, and a second substrate that is placed on the adhesive layer. The second substrate may consist of opaque metal.

The first electrode may have at least 80% or more of visible light transmittance, and the second electrode may have at least 80% or more of visible light transmittance.

A rear surface of the transparent substrate may be directly exposed to external light.

External light reflectance of the display area of the electro-luminescence display apparatus may be at least 5% or less.

The electro-luminescence display apparatus may further include a bank that is placed on the first electrode and that is overlapped with an edge of the first electrode, and the bank may be configured to absorb at least 80% or more of visible light.

The thin-film transistor array of the electro-luminescence display apparatus may include at least a first metallic layer and a second metallic layer, and may further include a light-absorbing layer that is placed on a rear surface of at least one or more of the first metallic layer and the second metallic layer.

The electro-luminescence display apparatus may further include a phase-correction layer that is placed between at least one or more metallic layers and the light-absorbing layer.

The light-absorbing layer may include one of copper oxide ($CuO_x$), nickel oxide ($NiO_x$), molybdenum oxide ($MoO_x$), and oxide of an alloy that includes two or more of copper/nickel/molybdenum.

The phase-correction layer may include one of silicon nitride (SiNx), indium gallium zinc oxide (IGZO), and indium tin oxide (ITO).

The electro-luminescence display apparatus according to the aspects may include a thin-film transistor array that is formed on a transparent substrate, a first electrode on the thin-film transistor array, an electro-luminescence diode on the thin-film transistor array, a second electrode on the electro-luminescence diode, and an external light-absorbing layer that is placed on the second electrode and is configured to absorb external light passing through the transparent substrate, the first electrode, the electro-luminescence diode, and the second electrode so as to improve an ambient light contrast ratio.

The transparent substrate may be configured to display an image through the rear surface thereof. The transparent substrate may not include a polarizing plate on the rear surface thereof. The rear surface of the transparent substrate may be configured to contact air. The rear surface of the transparent substrate may be provided with an anti-reflection coating.

The above description is provided only to exemplarily describe the present disclosure. The present disclosure may be modified in different forms by one having ordinary skill in the art without departing from the technical spirit of the disclosure. Thus, it should be understood that the present disclosure is not limited to the aspects set forth herein. It should be further understood that the scope of the disclosure is interpreted only by the appended claims and that equivalents to which such claims are entitled are included within the scope of the disclosure.

What is claimed is:

1. An electro-luminescence display apparatus, comprising:

a transparent substrate;

a thin-film transistor array disposed on the transparent substrate;

a first electrode disposed on the thin-film transistor array;

an electro-luminescence diode disposed on the first electrode;

a second electrode disposed on the electro-luminescence diode;

an encapsulation unit disposed on the second electrode; [and]

an external light-absorbing layer [disposed on the encapsulation unit and] absorbing external light that passes through the transparent substrate*; and*

*a black bank disposed on the first electrode and configured to have an opened area*, wherein the external light-absorbing layer has a shape matching a shape of the second electrode.

2. The electro-luminescence display apparatus of claim 1, wherein the external light-absorbing layer includes at least one of pigment black, black resin, graphite, gravure ink, black spray, black enamel, chromium and low reflective metal.

3. The electro-luminescence display apparatus of claim 1, wherein the electro-luminescence diode is configured to emit first light toward the first electrode and to emit second light toward the second electrode, and the second light is absorbed by the external light-absorbing layer.

4. The electro-luminescence display apparatus of claim 3, wherein at least 80% of the second light is absorbed by the external light-absorbing layer.

5. The electro-luminescence display apparatus of claim 1, further comprising:

an adhesive layer disposed on the external light-absorbing layer; and a second substrate disposed on the adhesive layer.

6. The electro-luminescence display apparatus of claim 5, wherein the second substrate includes *an* opaque metal.

7. The electro-luminescence display apparatus of claim 1, wherein the first electrode has at least 80% of visible light transmittance.

8. The electro-luminescence display apparatus of claim 1, wherein the second electrode has at least 80% of visible light transmittance.

9. The electro-luminescence display apparatus of claim 1, wherein a rear surface of the transparent substrate is directly exposed to external light.

10. The electro-luminescence display apparatus of claim 9, wherein the external light reflectance of a display area of the electro-luminescence display apparatus is not higher than 5%.

11. The electro-luminescence display apparatus of claim 1, [further comprising a] *wherein the black* bank [disposed on the first electrode and overlapping] *overlaps* an edge of the first electrode, wherein the *black* bank is configured to absorb at least 80% of visible light.

12. The electro-luminescence display apparatus of claim 1, further comprising an additional light-absorbing layer is [a] disposed on a rear surface of at least one of a first metallic layer and a second metallic layer of the thin-film transistor array.

13. The electro-luminescence display apparatus of claim 12, further comprising a phase-correction layer disposed between at least one of the first and second metallic layers and the additional light-absorbing layer.

14. The electro-luminescence display apparatus of claim 13, wherein the phase-correction layer includes at least one of silicon nitride, IGZO, and ITO.

15. The electro-luminescence display apparatus of claim 12, wherein the additional light-absorbing layer includes one of copper oxide, nickel oxide, molybdenum oxide, and oxide of an alloy that includes at least two of copper/nickel/molybdenum.

16. An electro-luminescence display apparatus, comprising:

a thin-film transistor array disposed on a transparent substrate;

a first electrode disposed on the thin-film transistor array;

an electro-luminescence diode disposed on the thin-film transistor array;

a second electrode disposed on the electro-luminescence diode; and an encapsulation unit disposed on the second electrode; and an external light-absorbing layer that is placed on the second electrode [and configured to absorb external light which passes through the transparent substrate, the first electrode, the electro-luminescence diode and the second electrode, and improving an ambient light contrast ratio], wherein the external light-absorbing layer has a shape matching a shape of the second electrode.

17. The electro-luminescence display apparatus of claim 16, wherein the transparent substrate is configured to display an image through a rear surface thereof.

18. The electro-luminescence display apparatus of claim 16, further comprising an additional encapsulation unit on the external light-absorbing layer.

19. The electro-luminescence display apparatus of claim 16, wherein a rear surface of the transparent substrate is exposed to air.

20. The electro-luminescence display apparatus of claim 16, wherein a rear surface of the transparent substrate is covered by an anti-reflection coating.

*21. The electro-luminescence display apparatus of claim 1, wherein the transparent substrate is foldable.*

*22. The electro-luminescence display apparatus of claim 1, wherein the black bank includes at least one or more of pigment black, black resins, graphite, black ink, gravure ink, black spray, and black enamel.*

*23. The electro-luminescence display apparatus of claim 1, further comprising an organic layer disposed on the thin-film transistor array,*

*wherein the organic layer includes a contact hole to connect the first electrode to the thin-film transistor array, and the black bank fills the contact hole.*

*24. The electro-luminescence display apparatus of claim 1, wherein the electro-luminescence display apparatus does not include a polarizing plate.*

*25. The electro-luminescence display apparatus of claim 1, further comprising an anti-reflection coating.*

*26. The electro-luminescence display apparatus of claim 16, wherein the transparent substrate is foldable.*

*27. The electro-luminescence display apparatus of claim 16, further comprising a black bank disposed on the first electrode and configured to have an opened area.*

*28. The electro-luminescence display apparatus of claim 27, wherein the black bank includes at least one or more of pigment black, black resins, graphite, black ink, gravure ink, black spray, and black enamel.*

*29. The electro-luminescence display apparatus of claim 27, further comprising an organic layer disposed on the thin-film transistor array,*

*wherein the organic layer includes a contact hole to connect the first electrode to the thin-film transistor array, and the black bank fills the contact hole.*

*30. The electro-luminescence display apparatus of claim 16, further comprising a color filter disposed on the substrate.*

*31. The electro-luminescence display apparatus of claim 30, wherein the electro-luminescence display apparatus does not include a polarizing plate.*

*32. The electro-luminescence display apparatus of claim 16, further comprising an anti-reflection coating.*

* * * * *